United States Patent [19]

Sherwood

[11] 4,059,890

[45] Nov. 29, 1977

[54] PIN LOADING SYSTEM

[75] Inventor: Theodore R. Sherwood, Sunnyvale, Calif.

[73] Assignee: The United States of America as represented by the Secretary of the Navy, Washington, D.C.

[21] Appl. No.: 662,643

[22] Filed: Mar. 1, 1976

[51] Int. Cl.$^2$ .............................................. H05K 3/32
[52] U.S. Cl. ....................................... 29/739; 29/626; 29/758; 29/760
[58] Field of Search ......... 29/203 B, 203 H, 203 HM, 29/203 J, 203 P, 626, 739, 758, 760; 228/49, 180, 212

[56] References Cited

U.S. PATENT DOCUMENTS

| 3,210,068 | 10/1965 | Shelton | 228/212 X |
| 3,545,606 | 12/1970 | Bennett et al. | 29/203 B |
| 3,640,519 | 2/1972 | Halstead | 29/203 B X |
| 3,875,636 | 4/1975 | Shultz, Jr. et al. | 29/203 B |
| 3,946,477 | 3/1976 | Cobaugh et al. | 29/203 B |

Primary Examiner—Carl E. Hall
Attorney, Agent, or Firm—R. S. Sciascia; Charles D. B. Curry; Elliott N. Kramsky

[57] ABSTRACT

A pin loading system to load wire wrap pins into a master interconnect board. A loading fixture includes a rod positioned within a wedge formed by the inclined interiors of a pair of abutting clamps. Its height therein may be varied by adjustment of a pair of knobs, allowing the alternative loosening and securing of pins to be mounted to a board. A shim placed below the fixture during the wave soldering process assures resilient pin connection.

7 Claims, 3 Drawing Figures

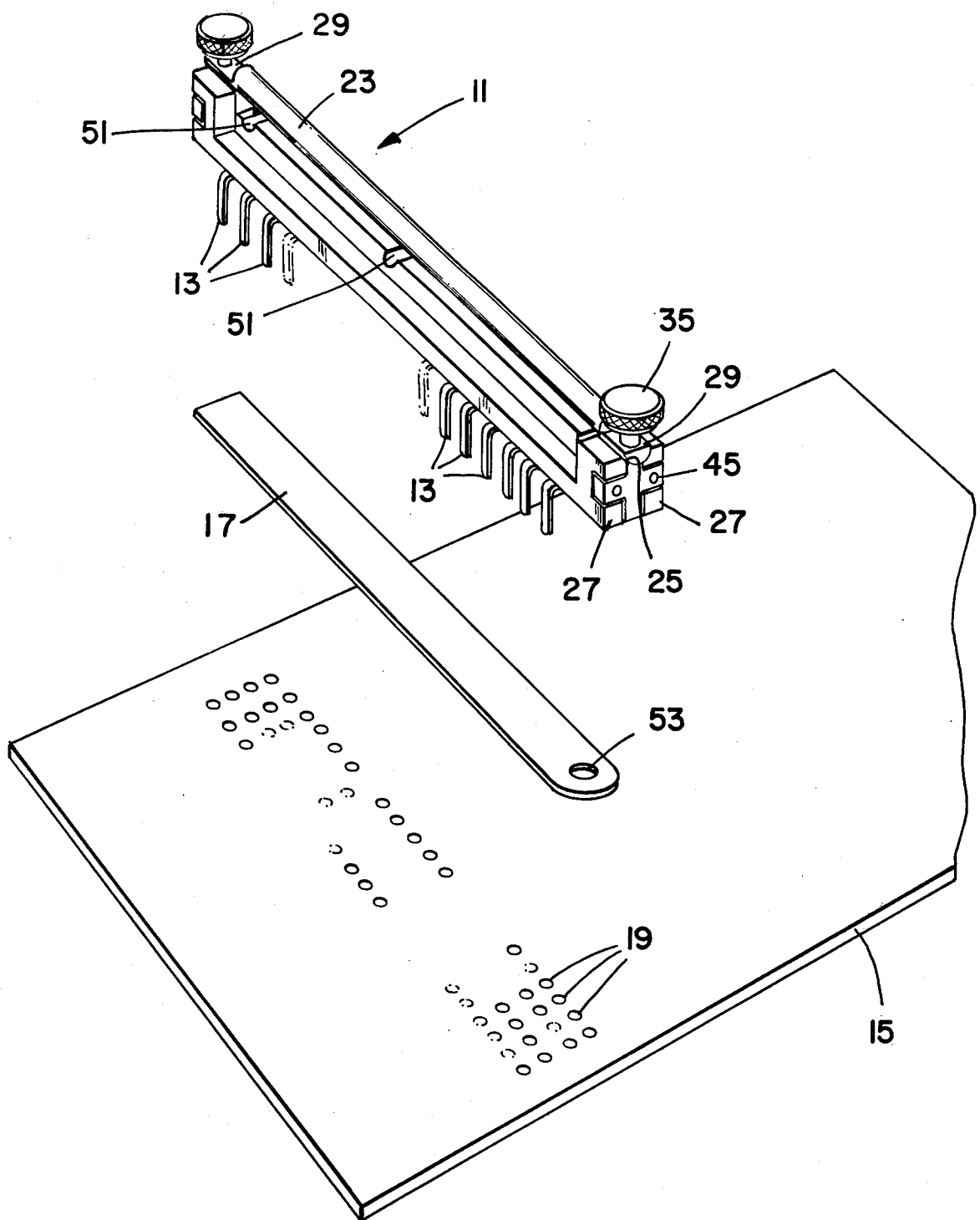
FIG_1

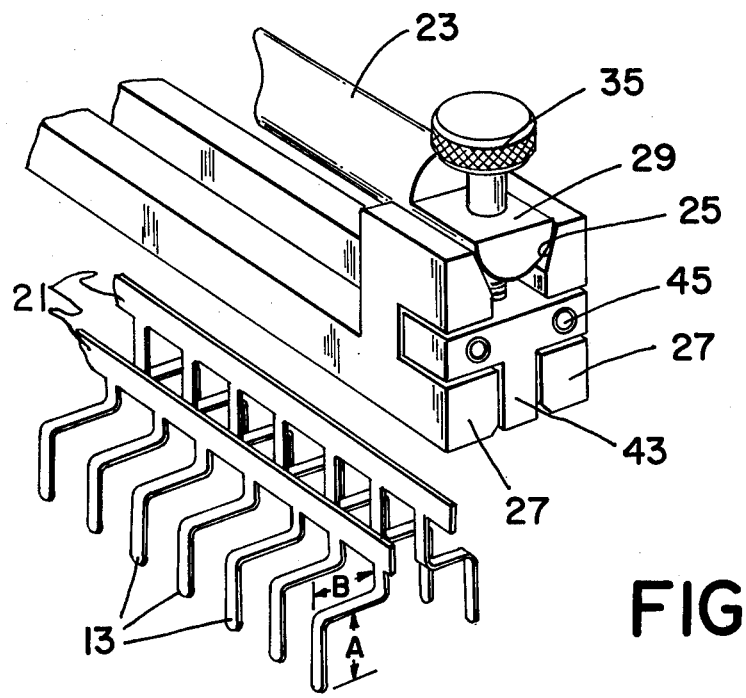
FIG _ 2
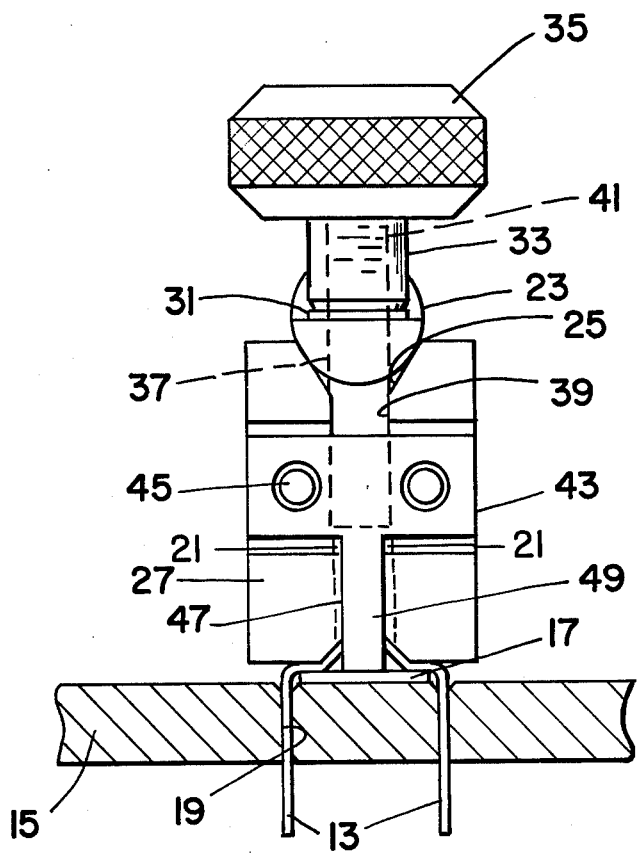
FIG _ 3

4,059,890

PIN LOADING SYSTEM

BACKGROUND OF THE INVENTION

1. Field of the Invention

The present invention relates to electronic circuit fabrication. In particular, it relates to devices and methods for facilitating the attachment of contact pins to a master interconnect board.

2. Description of the Prior Art

Progress in the arts associated with miniaturization and micro-miniaturization of electronic devices and components has advanced more rapidly than implementing hardware in many cases. Many hardware limitations encountered are related to the multiplication of tiny leads, or contact pins, per area of eletronic package or device. To solve the problem industry has turned to machines which install pins one at a time, automatically. Often, however, the set-up time cannot be justified due to the customized nature of a desired curcuit pattern or configuration.

The present invention allows the simultaneous and economical attachment of a multiplicity of contact pins to a master interconnect board by providing a loading fixture of very thin design into which one or two ganged strips of contact pins may be clamped. A shim placed beneath the loading fixture assures that individual soldered contacts will not degrade pn resilience.

SUMMARY OF THE INVENTION

Briefly, the present invention comprises a pin loading system to load wire wrap pins into a master interconnect board. A loading fixture includes a rod positioned within a wedge formed by the inclined interiors of a pair of abutting clamps. Its height therein may be varied by adjustment of a pair of knobs, allowing the alternate loosening of pins to be mounted to a board. A shim placed below the fixture during the wave soldering process assures resilient pin connection.

OBJECTS OF THE INVENTION

An object of the present invention is to provide an apparatus to aid the attachment of contact pins to a board.

Another object of the present invention is to achieve the above object by means of an apparatus of a simplified, thin design.

Yet another object of the present invention is to achieve an apparatus especially useful for positioning contact pins for wave soldering to a master interconnect board.

Still another object of the present invention is to achieve the above object by means of a device which will prevent the loss of pin resilience due to the wave soldering process.

Other objects, advantages and novel features of the invention will become apparent from the following detailed description of the invention when considered in conjunction with the accompanying drawings wherein:

BRIEF DESCRIPTION OF THE DRAWINGS

FIG. 1 is a perspective view of the present invention showing the contact pins loaded into the loading fixture;

FIG. 2 is an enlarged partial perspective view of the loading fixture of the invention; and FIG. 3 is an end view of the present invention.

DESCRIPTION OF THE PREFERRED EMBODIMENT

Turning now to the drawings, there is shown in FIG. 1 a partial exploded perspective view of the present invention. Loading fixture 11 acts to contain and align a plurality of contact pins 13 for insertion into a master interconnect board 15. A shim 17 is located between the loading fixture 11 and a master interconnect board 15 during wave soldering of the pins 13 to the board 15 to provide the pins 13 with post-soldering flexibility. The preferred operation of the present invention involves manual operations, making non-corroding materials such as stainless steel an especially desirable material for fabrication of loading fixture 11. The shim 17 may also be advantageously fabricated of stainless steel to take advantage of that material's qualities of limited heat conduction and solder non-wetting.

It is seen in FIG. 1 and in FIG. 2 that loading fixture 11 is of elongated design. Such design is dictated by the narrow spacing of the contact holes 19 of present generation boards 15. The pins 13 which are to be inserted into such a board 15 are commonly of the z-type. Once mounted to board 15 further electrical linkage to such pins 13 may be accomplished by well known methods including conductor to conductor soldering or wire wrapping. FIG. 2 illustrates the pre-mounting arrangement of a plurality of such pins 13. During manufacture, a plurality of such pins 13 commonly may be ganged onto a common rail 21 which will simplify the loading process. In FIG. 1 it is seen that the pins 13, when loaded into loading fixture 11 protrude therefrom while secured in fixture 11 at common rail 21. The pins desirable for typical useful applications are quite delicate. Those of the z-type have been successfully loaded for wave soldering by means of the present invention having an A dimension of 0.165 inch and a B dimension of 0.100 inch with cross section of 0.01 inch by 0.025 inch.

The mechanism of loading fixture 11 is regulated by the action of cylindrical rod 23 against the inclined interiors 25 of side clamps 27. The rod 23 and clamps 27 run the full length of loading fixture 11. At its end portions, the rod 23 has a pair of flattened plateaus 29. It may be seen clearly in FIG. 3 that a thrust washer 31 sits atop each flattened plateau 29. This washer 31 takes pressure and provides a sliding surface for the bottom portion of the shaft 23 of knob 35. The knobs 35 are interiorly threaded at their shafts 33 to provide for attachment to stud 37 which is threaded throughout except for a small portion which abuts against the smooth inner walls 39 of clamps 27. For ease of manufacture with regard to tolerances, an overdrilled gap 41 exists at the top of the interior threading of shaft 39.

Stud 37 passes through washer 31 and rod 23 and enters T-shaped spacer 43, into which its lower portion is anchored. A pair of pivot pins 45 join clamps 27 to spacer 43. The pins 45 are press fit into spacer 43 and free fit to clamps 27. This allows rotation of the clamps 27 relative to spacer 43 about pins 45 when rod 23 is moved relative to the wedge formed by interior inclines 25 of clamps 27.

In operation, the loading fixture 11 is prepared to accept pins 13 for insertion into a master interconnect board 15 by the manipulation of knobs 35 in such a way as to cause rod 23 to be raised or loosened within the wedge defined by the interior inclines 25 of clamps 27. Slack is thus created which will allow the clamps 27 to rotate outwardly at their lower halves when pressed together at their upper halves to form a gap at the interior junction 47 of clamps with spacer 43.

The round, flat shape of knobs 35 allows the operator to invert the loading fixture 11 for more convenient operation with the knobs 35 serving as a stable base for the inverted loading fixture 11. The pins 13 are inserted into the gap created at the lower junction 47 at their common rail 21. The operator next manually closes the clamps by squeezing the sides of loading fixture 11 together (as opposed to manipulating the knobs 35), thus rotating the clamps 27 inwardly at their lower halves to grip the common rail 21 at the interior junction 47 of the clamps with the spacer 43. One hand is sufficient to maintain the pins 13 in position by such squeezing, thus freeing the other hand to re-invert loading fixture 11 and turn the knobs 35 in such a direction as to lower or tighten rod 23 within the wedge formed by the the interior inclines 25 of the clamps 27. The lower portion 49 of T-shaped spacer 43 will abut against the lower portion of the clamps 27 to permit opening only at the lower half of the clamps 27. The parallel position of clamps 27 illustrated in FIGS. 1, 2 and 3 will result from the full turning of knobs 35 described in the aforementioned step. (Throughout this description "lower" and "upper" halves refer, respectively, to the portions of clamps 27 below and above pivot pins 45 when loading fixture 11 is in the knob 35 up position.)

The pins 13, now clamped into loading fixture 11, are ready for manual insertion into master interconnect board 15. Shim 17 is placed under loading fixture 11, providing a mutual interface for the board 15 and loading fixture 11. As previously mentioned, the qualities of non-wettability to solder and minimal heat conduction make stainless steel an appropriate material for shim 17. It will be understood by those skilled in the art that other materials may be employed provided they are compatible with the requirements of the invention described herein. The loading fixture 11, pins 13 clamped within and shim 17 positioned underneath, is next placed into its desired location on master interconnect board 15. Previous to the insertion of the pins 13 into loading fixture 11, the proper number and spacing of pins necessary to make connection with the proper input holes 19 on master interconnect board 15 is achieved by shortening of the lenght of common rail 21 and removal of individual pins 13 as necessary. Thus only one standard size pin supply is necessitated for successful operation of the present invention, allowing substantial economic savings.

The loading fixture 11 now commutes with master interconnect board 15 as illustrated in cross section in FIG. 3. Due to the thin width of the loading fixture 11, a plurality of such fixtures 11 might properly be positioned side-to-side to multiply the number of pins 13 which might be fixed in one wave soldering. The wave soldering process, a technique well known to those skilled in the art, causes a wave of solder to wash along the underside of master interconnect board 15, fixing electrical connection between the individual pins 13 and the conductor-lined input holes 19 of the master interconnect board 15. The shim 17 prevents infiltration of solder beneath the B dimension of the pins 13, allowing the now-soldered pins 13 more degrees of freedom for making future electrical connections to the master interconnect board 15 of which it is now a part.

A plurality of notches 51 are provided in the interior of T-shaped spacer 43 to allow for the insertion of a break-off tool (not shown). Such a tool, which may be of quite simple design such as a flat elongated piece of metal, may now be run along the upper junction of the clamp 27 and spacer 43 to wedge out and remove the common rail 21 from the soldered pins 13. A tool having a hook-type feature (not shown) may next be used to remove the shim 17 by inserting the hook into the hole 53 on the protruding end of shim 17. The non-wettability of solder to stainless steel allows the shim to be simply and cleanly removed by movement of the hook-type tool. Its poor heat conductivity provides some insulation of the non-soldered portions of the pins 13 from the applied solder's heat, which might otherwise cause the pins 13 to be brittle.

The knobs 35 are now turned in such a manner as to cause the rod 23 to rise or be loosened with the wedge between the clamps 27. The upper outside portions of the clamps 27 may now be squeezed to cause the lower portions to pivot outwardly, releasing the clamped restraint on the pins 13. The loading fixture 11 may now be lifted off master interconnect board 15 to leave the soldered pins 13 securely fixed in place. The pins 13 and board 15 are now ready for the final step of the wave soldering process, to wit, the fly cutting of the pins 13, if necessary, to a desired and uniform height.

Thus it is seen that there is provided a pin loading system especially adapted to allow and aid the efficient and simplified fixation of electrical contacts to a board.

What is claimed is:

1. A loading system for loading at least one contact pin onto a board having an upper side and a lower side and having at least one mating hole therefor which system comprises:
    a. at least one elongated clamp rotatably mounted about its longitudinal axis having end portions with a notch therein and an outwardly inclined inner cross-section, and having an interior portion of lesser height than said end portions to allow for exposure of a contact pin common rail attached to said at least one contact pin for removal tool access;
    b. an elongated spacer having a rectangular interior portion and T-shaped end portions, at least one arm of said T-shaped end portions being pivotally engaged to said at least one elongated clamp;
    c. an elongated cylindrical rod in abutting relationship with said outwardly inclined inner cross-section; and
    e. elevation means to adjust the location of said rod relative to said outwardly inclined inner cross-section so that said at least one elongated clamp rotates about said longitudinal axis with the lower edge of said at least one elongated clamp forcefully engaging said at least one contact pin to hold said at least one contact pin within said loading system.

2. A loading system as described in claim 1 wherein said elevation means comprises:
    a. a pair of interiorly threaded knobs, each of said knobs located at one of opposite ends of said elongated rod;
    b. a pair of threaded studs, each fitted into one of opposite end portions of said spacer;
    c. said rod having holes passing through each of opposite ends thereof;
    d. each of said studs passing through each of said holes in said rod; and
    e. each of said knobs threaded onto each of said stubs whereby the loosening and tightening of said knobs on said stubs causes the abutting relationship of said elongated rod and said at last one elongated clamp to be tightened and loosened.

3. A loading system as described in claim 2 wherein each of said knobs is of circular cross section and has a flat top.

4. A loading system as recited in claim 3 further comprising a flat shim having an upper side and a lower side for spacing said at least one elongated clamp and at least one contact pin from said upper side of said board, and having a longitudinal extension which protrudes when said flat shim is located between said top side of said board and at least one elongated clamp, said longitudinal extension having a hole therein for attachment and use of a removal tool.

5. A loading system as described in claim 4 wherein there exists at least one notch interior to said T section for the insertion of a rail-stripping tool.

6. A loading system as described in claim 5 wherein said shim is fabricated of stainless steel.

7. A loading system as described in claim 6 wherein said retaining means is fabricated of stainless steel.

* * * * *